US012057519B2

(12) United States Patent
Cho et al.

(10) Patent No.: US 12,057,519 B2
(45) Date of Patent: Aug. 6, 2024

(54) SELF-ASSEMBLY APPARATUS AND METHOD FOR SEMICONDUCTOR LIGHT EMITTING DEVICE

(71) Applicant: LG ELECTRONICS INC., Seoul (KR)

(72) Inventors: Hyunwoo Cho, Seoul (KR); Bongchu Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 619 days.

(21) Appl. No.: 17/289,549

(22) PCT Filed: Oct. 8, 2019

(86) PCT No.: PCT/KR2019/013162
§ 371 (c)(1),
(2) Date: Apr. 28, 2021

(87) PCT Pub. No.: WO2020/091252
PCT Pub. Date: May 7, 2020

(65) Prior Publication Data
US 2021/0399160 A1   Dec. 23, 2021

(30) Foreign Application Priority Data
Oct. 30, 2018 (KR) .................. 10-2018-0131209

(51) Int. Cl.
*H01L 33/00* (2010.01)
*H01L 25/075* (2006.01)
*H01L 21/68* (2006.01)

(52) U.S. Cl.
CPC ........ *H01L 33/005* (2013.01); *H01L 25/0753* (2013.01); *H01L 21/68* (2013.01)

(58) Field of Classification Search
None
See application file for complete search history.

(56) References Cited

U.S. PATENT DOCUMENTS 9,825,202 B2   11/2017 Schuele et al.
10,971,654 B2 *  4/2021 Kim .................. H01L 33/62
(Continued)

FOREIGN PATENT DOCUMENTS

JP   2011-13043 A    1/2011
KR   10-0885187 B1   2/2009
(Continued)

*Primary Examiner* — Hsien Ming Lee
(74) *Attorney, Agent, or Firm* — Birch, Stewart, Kolasch & Birch, LLP

(57) ABSTRACT

Discussed is a self-assembly apparatus of a semiconductor light emitting device, the self-assembly apparatus including a fluid chamber configured to accommodate a plurality of semiconductor light emitting devices, each semiconductor light emitting device having a magnetic body; a magnet disposed to be spaced apart from the fluid chamber and configured to apply a magnetic force to the plurality of semiconductor light emitting devices; and a position controller connected to the magnet, and configured to control a position of the magnet; and a power supply configured to induce formation of an electric field on a substrate placed at an assembly position so that the plurality of semiconductor light emitting devices are seated at preset positions on the substrate while being moved due to a positional change of the magnet, wherein the position controller transfers the magnet in one direction while rotating the magnet about a rotation axis for the magnet.

18 Claims, 18 Drawing Sheets

(56) References Cited

U.S. PATENT DOCUMENTS

| | | | |
|---|---|---|---|
| 2002/0005294 | A1 | 1/2002 | Mayer et al. |
| 2007/0087472 | A1 | 4/2007 | Huber et al. |
| 2008/0278721 | A1 | 11/2008 | Bai et al. |
| 2013/0168708 | A1 | 7/2013 | Shibata et al. |
| 2013/0302935 | A1 | 11/2013 | Dai et al. |
| 2015/0050761 | A1 | 2/2015 | Karlicek et al. |
| 2018/0029038 | A1 | 2/2018 | Sasaki et al. |

FOREIGN PATENT DOCUMENTS

| | | |
|---|---|---|
| KR | 10-2013-0033450 A | 4/2013 |
| KR | 10-2015-0005628 A | 1/2015 |

* cited by examiner (a)

(b)

(c)

(a)

(b)

SELF-ASSEMBLY APPARATUS AND METHOD FOR SEMICONDUCTOR LIGHT EMITTING DEVICE

CROSS REFERENCE TO RELATED APPLICATIONS

This application is the National Stage filing under 35 U.S.C. 371 of International Application No. PCT/KR2019/013162, filed on Oct. 8, 2019, which claims the benefit of earlier filing date and right of priority to Korean Application No. 10-2018-0131209 filed on Oct. 30, 2018, the entire contents of all of these applications are all hereby expressly incorporated by reference in their entirety into the present application.

BACKGROUND

1. Technical Field

The present disclosure relates to a method of manufacturing a display device, and more particularly, to a method and apparatus of self-assembling a semiconductor light emitting device.

2. Description of the Related Art

In recent years, liquid crystal displays (LCDs), organic light emitting diode (OLED) displays, and micro-LED displays have been competed to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting devices (micro-LED (µLED)) having a diameter or a cross sectional area of 100 microns or less are used in a display, the display may provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro-LED structure suitable for self-assembly, but there is not yet research on technologies for manufacturing a display through self-assembly of micro-LEDs. Accordingly, the present disclosure proposes a new type of manufacturing method and apparatus in which micro-LEDs can be self-assembled.

SUMMARY

An aspect of the present disclosure is to provide a new manufacturing process with high reliability in a large-screen display using micro-sized semiconductor light emitting devices.

Another aspect of the present disclosure is to provide a manufacturing process capable of improving transfer precision when self-assembling a semiconductor light emitting device with a temporary substrate or a wiring substrate.

The present disclosure may provide a self-assembly apparatus of a semiconductor light emitting device, including a fluid chamber provided with a space for accommodating a plurality of semiconductor light emitting devices each having a magnetic body, a transfer unit that transfers a substrate to an assembly position, a magnet disposed to be spaced apart from the fluid chamber so as to apply a magnetic force to the semiconductor light emitting devices, a position controller connected to the magnet, and configured to control a position of the magnet, and a power supply unit that induces the formation of an electric field on the substrate such that the semiconductor light emitting devices are seated at preset positions on the substrate in a process of moving due to a positional change of the magnet, wherein the position controller transfers a rotation axis in one direction while rotating the magnet about the rotation axis.

In one embodiment, the rotation axis may be perpendicular to the substrate, and disposed outside the magnet.

In one embodiment, the magnet may be provided in plural, and the position controller may transfer the plurality of magnets in one direction while rotating the plurality of magnets together about together.

In one embodiment, the position controller may be provided with a magnetic array to which a plurality of magnets are fixed to be transferred while rotating the magnetic array.

In one embodiment, the N and S poles of the magnet may be disposed in a direction horizontal to the substrate such that a magnetic force applied to the semiconductor light emitting devices is formed in a direction horizontal to the substrate.

In one embodiment, the magnet may include a first magnet in which either one of the N and S poles thereof is disposed to face the substrate, and a second magnet disposed at a position adjacent to the first magnet such that the other one of the N and S poles thereof is disposed to face the substrate.

In one embodiment, the present disclosure may further include a magnet connecting portion that connects the magnet and the position controller to guide a vertical movement of the magnet with respect to the substrate.

In one embodiment, at least part of the substrate may be made of a curved surface at the assembly position, and the magnet connecting portion may guide a vertical movement of the magnet such that the magnet is brought into close contact with the substrate while the magnet is transferred along the one direction with rotation.

In one embodiment, the magnet connecting portion may include at least one of an elastic member that applies an elastic force to the magnet and a magnetic member that applies a magnetic force to the magnet.

In addition, the present disclosure may provide a method of self-aligning a semiconductor light emitting device, and the method may include transferring a substrate to an assembly position, and placing semiconductor light emitting devices into a fluid chamber, applying a magnetic force to the semiconductor light emitting devices to move the semiconductor light emitting devices along one direction in the fluid chamber, and applying an electric field to guide the semiconductor light emitting devices to preset positions on the substrate such that the semiconductor light emitting devices are seated at the preset positions during the movement of the semiconductor light emitting devices, wherein said applying a magnetic force to the semiconductor light emitting devices transfers a rotation axis along the one direction while rotating a magnet about the rotation axis.

In one embodiment, the rotation axis may be perpendicular to the substrate, and disposed outside the magnet.

In one embodiment, the magnet may be provided in plural, and the plurality of magnets may be transferred along the one direction while rotating together.

In one embodiment, the N and S poles of the magnet may be disposed in a direction horizontal to the substrate such that a magnetic force applied to the semiconductor light emitting devices is formed in a direction horizontal to the substrate.

In one embodiment, the magnet may include a first magnet in which either one of the N and S poles thereof is disposed to face the substrate, and a second magnet disposed at a position adjacent to the first magnet such that the other one of the N and S poles thereof is disposed to face the substrate.

In one embodiment, said applying a magnetic force to the semiconductor light emitting devices may include moving the magnet up and down with respect to the substrate such that the magnet is brought into close contact with the substrate.

According to the present disclosure having the foregoing configuration, a large number of semiconductor light emitting devices may be assembled at one time in a display device in which individual pixels are formed with micro light emitting diodes.

As described above, according to the present disclosure, a large number of semiconductor light emitting devices may be pixelated on a wafer having a small size, and then transferred onto a large-area substrate. Through this, it may be possible to manufacture a large-area display device at a low cost.

Furthermore, according to the present disclosure, it may be possible to minimize a frictional force that may be generated between the substrate and the semiconductor light emitting device during transfer of the substrate. Through this, the present disclosure may prevent the semiconductor light emitting device from being damaged during assembly or being excessively aggregated at one location, and moreover, may improve transfer accuracy.

In addition, according to the present disclosure, when a magnetic force is applied to a semiconductor light emitting device, the semiconductor light emitting device may be disposed horizontally on the substrate. Through this, the present disclosure may allow the semiconductor light emitting devices to be accurately seated at designated positions on the substrate.

Moreover, according to the present disclosure, even when the substrate having a large area is bent during transfer, a distance between the semiconductor light emitting device and magnets may be kept constant, and accordingly, a magnetic force applied to the semiconductor light emitting device may become uniform. Through this, the present disclosure may improve transfer accuracy.

DETAILED DESCRIPTION OF THE EMBODIMENTS

Figure 1:
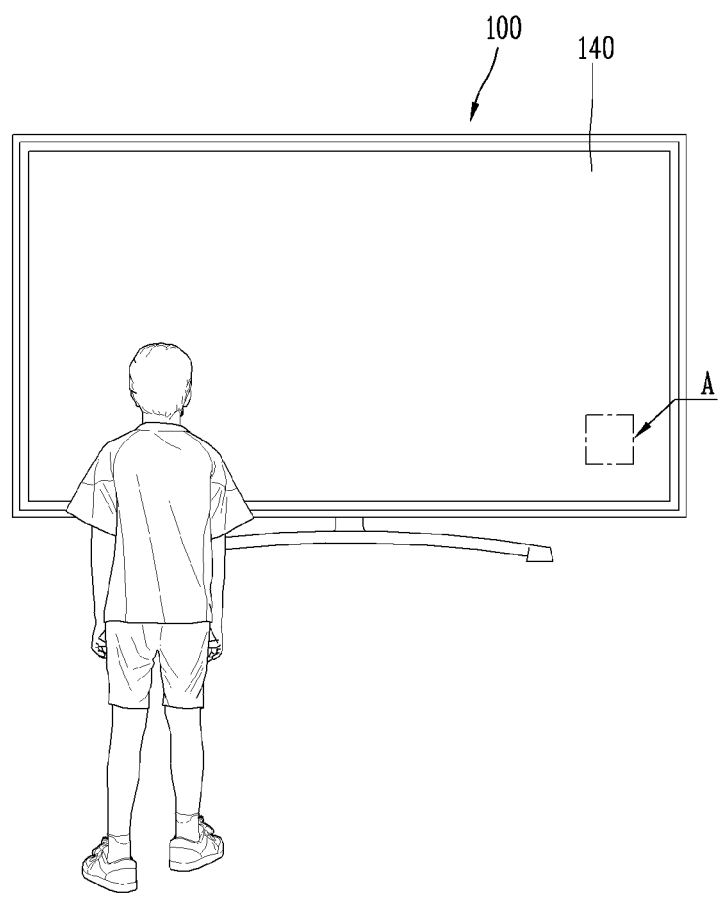
FIG. 1 is a conceptual view showing a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein may be applicable to any displayable device even though it is a new product type which will be developed later.

Figure 2:
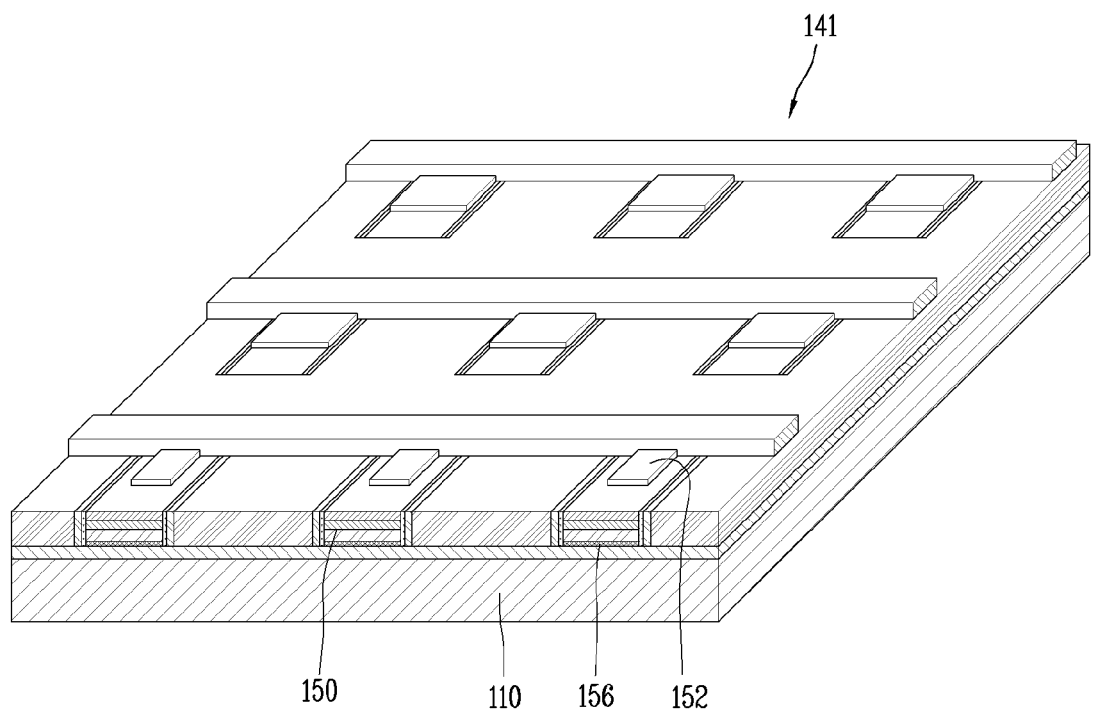
FIG. 2 is a partially enlarged view showing a portion "A" of the display device in FIG. 1.
Figure 3:
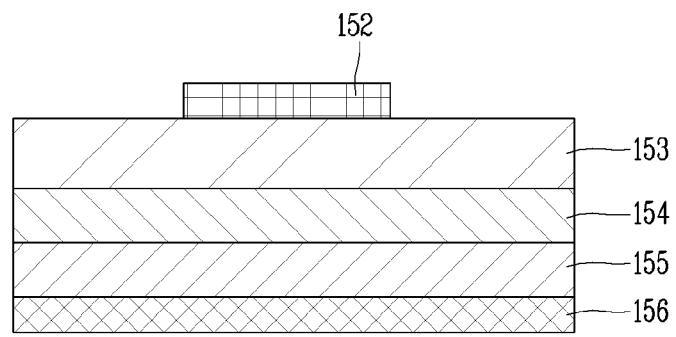
FIG. 3 is an enlarged view showing a semiconductor light emitting device in FIG. 2.
Figure 4:
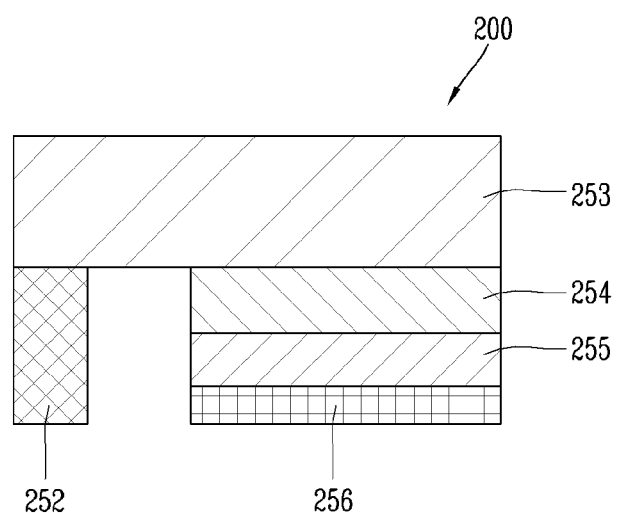
FIG. 4 is an enlarged view showing another embodiment of the semiconductor light emitting device in FIG. 2.

FIG. 1 is a conceptual view showing a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIG. 4 is an enlarged view showing another embodiment of the semiconductor light emitting device in FIG. 2.

According to the illustration, information processed in the controller of the display device 100 may be displayed on a display module 140. A case 101 in the form of a closed loop surrounding an edge of the display module may form a bezel of the display device.

The display module 140 may include a panel 141 on which an image is displayed, and the panel 141 may include micro-sized semiconductor light emitting devices 150 and a wiring substrate 110 on which the semiconductor light emitting devices 150 are mounted.

Wiring lines may be formed on the wiring substrate 110, and connected to an n-type electrode 152 and a p-type electrode 156 of the semiconductor light emitting device 150. Through this, the semiconductor light emitting device 150 may be provided on the wiring substrate 110 as a self-emitting individual pixel.

An image displayed on the panel 141 is visual information, and implemented by independently controlling the light emission of sub-pixels arranged in a matrix form through the wiring lines.

According to the present disclosure, a micro-LED (Light Emitting Diode) is illustrated as one type of the semiconductor light emitting device 150 that converts current into light. The micro-LED may be a light emitting diode formed with a small size of 100 microns or less. The semiconductor light emitting device 150 may be provided in blue, red, and green light emitting regions, respectively, to implement a sub-pixel by a combination of the light emitting regions. In other words, the sub-pixel denotes a minimum unit for implementing a single color, and at least three micro-LEDs may be provided in the sub-pixel.

More specifically, referring to FIG. 3, the semiconductor light emitting device 150 may be a vertical structure.

For example, the semiconductor light emitting devices 150 may be implemented with a high-power light emitting device that emits various lights including blue in which gallium nitride (GaN) is mostly used, and indium (In) and or aluminum (Al) are added thereto.

The vertical semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate, and the n-type electrode 152 located at the top may be electrically connected to an n-electrode at an upper side of the semiconductor light emitting device. The electrodes may be disposed in the upward/downward direction in the vertical semiconductor light emitting device 150, thereby providing a great advantage capable of reducing the chip size.

For another example, referring to FIG. 4, the semiconductor light emitting device may be a flip chip type semiconductor light emitting device.

For such an example, the semiconductor light emitting device 200 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate at the bottom of the semiconductor light emitting device.

The vertical semiconductor light emitting device and the horizontal semiconductor light emitting device may be a green semiconductor light emitting device, a blue semiconductor light emitting device, or a red semiconductor light emitting device, respectively. The green semiconductor light emitting device and the blue semiconductor light emitting device may be mostly formed of gallium nitride (GaN), and indium (In) and/or aluminum (Al) may be added thereto to implement a high-power light emitting device that emits green or blue light. For such an example, the semiconductor light emitting device may be a gallium nitride thin-film formed in various layers such as n-Gan, p-Gan, AlGaN, and InGa, and specifically, the p-type semiconductor layer may be p-type GaN, and the n-type semiconductor layer may be N-type GaN. However, in case of the red semiconductor light emitting device, the p-type semiconductor layer may be p-type GaAs and the n-type semiconductor layer may be n-type GaAs.

In addition, a p-electrode side in the p-type semiconductor layer may be p-type GaN doped with Mg, and an n-electrode side in the n-type semiconductor layer may be n-type GaN doped with Si. In this case, the above-described semiconductor light emitting devices may be semiconductor light emitting devices without an active layer.

On the other hand, referring to FIGS. 1 through 4, since the light emitting diode is very small, the display panel may be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a preset position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new manufacturing method of a display device capable of solving the foregoing problems and a manufacturing device using the same.

For this purpose, first, a new manufacturing method of the display device will be described. FIGS. 5A through 5E are conceptual views for explaining a new process of manufacturing the foregoing semiconductor light emitting device.

In this specification, a display device using a passive matrix (PM) semiconductor light emitting device is illustrated. However, an example described below may also be applicable to an active-matrix (AM) type semiconductor light emitting element. In addition, a method of self-assembling a horizontal semiconductor light emitting device is illustrated, but it is also applicable to a method of self-assembling a vertical semiconductor light emitting device.

First, according to a manufacturing method, a first conductive semiconductor layer 153, an active layer 154, and a second conductive semiconductor layer 155 are respectively grown on a growth substrate 159.

Figure 5A:
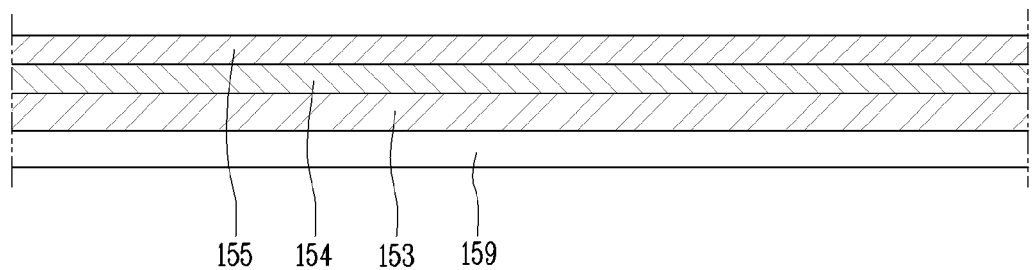
FIGS. 5A to 5E are conceptual views for explaining a new process of manufacturing the foregoing semiconductor light emitting device.

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

In addition, the present embodiment illustrates a case where the active layer is present, but it is also possible to adopt a structure in which the active layer is not present as described above. For such an example, the p-type semiconductor layer may be p-type GaN doped with Mg, and an n-electrode side in the n-type semiconductor layer may be n-type GaN doped with Si.

The growth substrate 159 (wafer) may be formed of any one of materials having light transmission properties, for example, sapphire ($Al_2O_3$), GaN, ZnO, and AlO, but is not limited thereto. Furthermore, the growth substrate 1059 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Figure 5B:
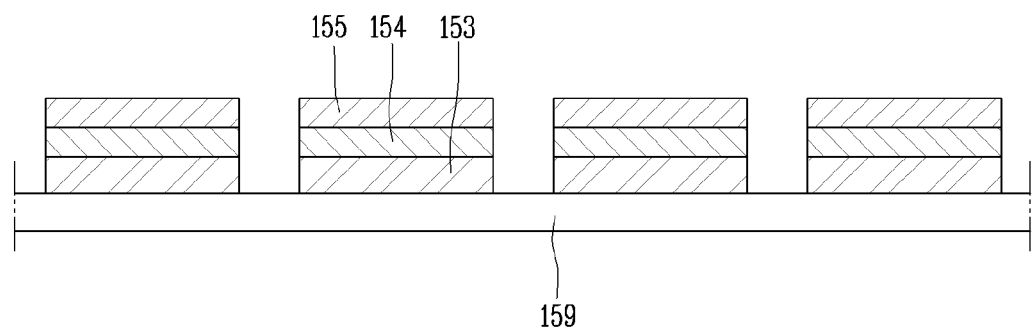

Next, at least part of the first conductive semiconductor layer 153, the active layer 154, and the second conductive semiconductor layer 155 is removed to form a plurality of semiconductor light emitting devices (FIG. 5B).

More specifically, isolation is performed to allow a plurality of light emitting devices form a light emitting device array. In other words, the first conductive semiconductor layer 153, the active layer 154, and the second conductive semiconductor layer 155 are etched in a vertical direction to form a plurality of semiconductor light emitting devices.

If it is a case of forming the horizontal semiconductor light emitting device, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light emitting device arrays.

Figure 5C:
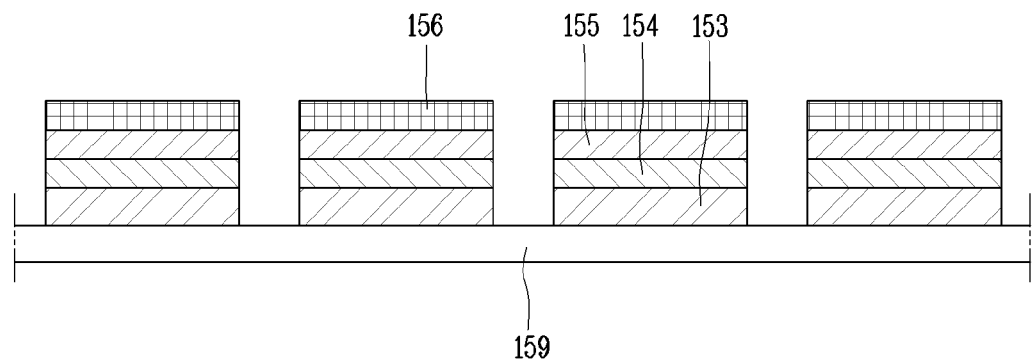

Next, a second conductive electrode 156 (or a p-type electrode) is respectively formed on one surface of the second conductive semiconductor layer 155 (FIG. 5C). The second conductive electrode 156 may be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
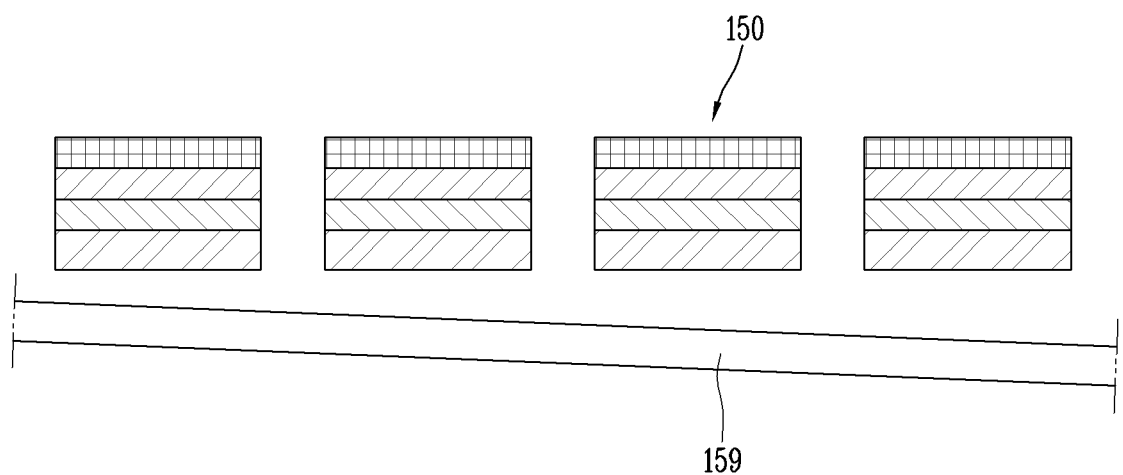

Then, the growth substrate 159 is removed to provide a plurality of semiconductor light emitting devices. For example, the growth substrate 159 may be removed using a laser lift-off (LLO) or chemical lift-off (CLO) method (FIG. 5D).

Figure 5E:
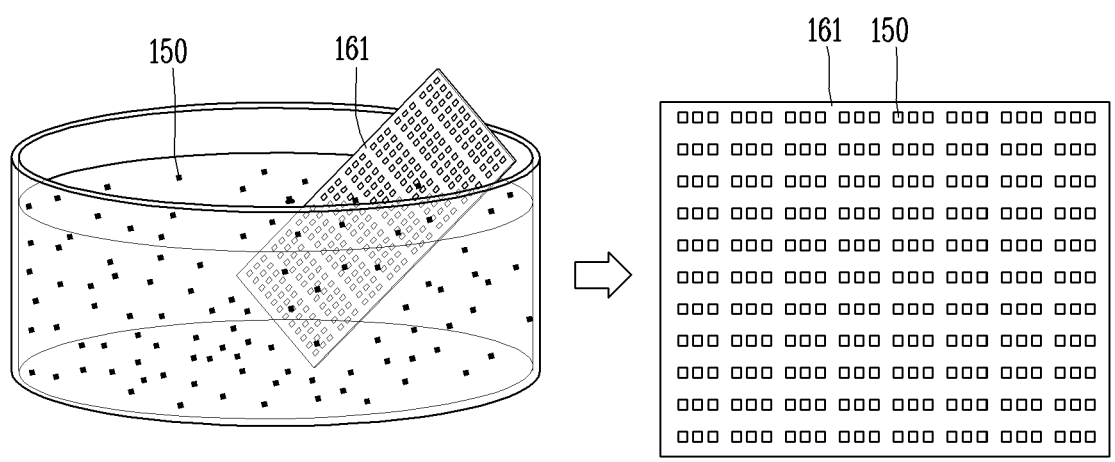

Then, the process of mounting the semiconductor light emitting devices 150 on the substrate in a chamber filled with a fluid is carried out (FIG. 5E).

For example, the semiconductor light emitting devices 150 and the substrate are placed in a chamber filled with a fluid, and the semiconductor light emitting devices are assembled to the substrate 1061 by themselves using flow, gravity, surface tension, or the like. In this case, the substrate may be an assembly substrate 161.

For another example, the wiring substrate may also be placed in the fluid chamber instead of the assembly substrate 161 such that the semiconductor light emitting elements 150 are directly seated on the wiring substrate. In this case, the substrate can be a wiring substrate. However, for convenience of description, in the present disclosure, it is illustrated that the substrate is provided as an assembly substrate 161 and the semiconductor light emitting elements 1050 are seated thereon.

Cells (not shown) into which the semiconductor light emitting devices 150 are fitted may be provided on the assembly substrate 161 so that the semiconductor light emitting elements 150 are easily seated on the assembly substrate 161. Specifically, cells on which the semiconductor light emitting devices 150 are seated are formed on the assembly substrate 161 at a position where the semiconductor light emitting devices 150 are aligned with the wiring electrode. The semiconductor light emitting devices 150 are assembled into the cells while moving in the fluid.

When the plurality of semiconductor light emitting devices are arrayed on the assembly substrate 161, and then the semiconductor light emitting devices on the assembly substrate 161 are transferred to the wiring substrate, it may enable large-area transfer. Therefore, the assembly substrate 161 may be referred to as a temporary substrate.

Meanwhile, the self-assembly method described above must increase transfer yield when applied to the manufacturing of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light emitting device to move the semiconductor light emitting device using a magnetic force, and place the semiconductor light emitting device at a preset position using an electric field in the movement process. Hereinafter, such a transfer method and device will be described in more detail with reference to the accompanying drawings.

Figure 6:
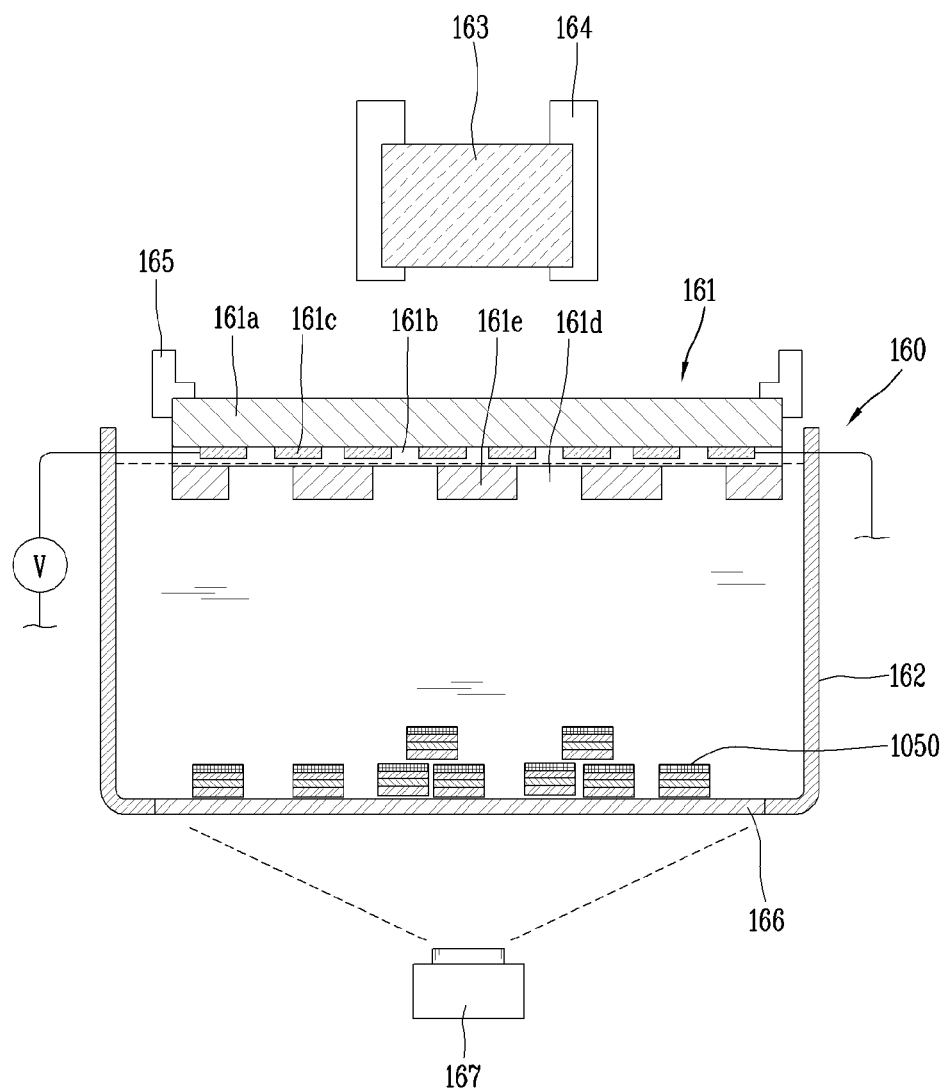
FIG. 6 is a conceptual view showing an example of a self-assembly device of semiconductor light emitting devices according to the present disclosure.
Figure 7:
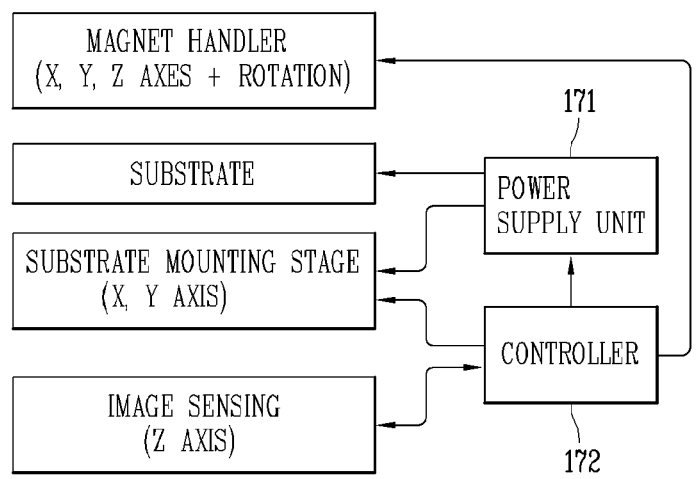
FIG. 7 is a block diagram showing the self-assembly device in FIG. 6.

FIG. 6 is a conceptual view showing an example of a self-assembly device of semiconductor light emitting devices according to the present disclosure, and FIG. 7 is a block diagram showing the self-assembly device in FIG. 6. FIGS. 8A to 8E are conceptual views showing a process of self-assembling semiconductor light emitting devices using the self-assembly device in FIG. 6, and FIG. 9 is a conceptual view for explaining the semiconductor light emitting device in FIGS. 8A to 8E.

According to the illustration of FIGS. 6 and 7, a self-assembly device 160 of the present disclosure may include a fluid chamber 162, a magnet 163, and a position controller 164.

The fluid chamber 162 has a space for accommodating a plurality of semiconductor light emitting devices. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The substrate 161 may be disposed on the fluid chamber 162 such that an assembly surface on which the semiconductor light emitting devices 150 are assembled faces downward. For example, the substrate 161 may be transferred to an assembly position by a transfer unit, and the transfer unit may include a stage 165 on which the substrate is mounted. The stage 165 is positioned by the controller, and the substrate 161 may be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light emitting devices 150 are moved to the assembly surface in the fluid.

The substrate 161, which is an assembly substrate on which an electric field can be formed, may include a base portion 161a, a dielectric layer 161b and a plurality of electrodes 161c.

The base portion 161a may be made of an insulating material, and the plurality of electrodes 161c may be a thin or a thick film bi-planar electrode patterned on one side of the base portion 161a. The electrode 161c may be formed of, for example, a laminate of Ti/Cu/Ti, an Ag paste, ITO, and the like.

The dielectric layer 161b is made of an inorganic material such as $SiO_2$, SiNx, SiON, $Al_2O_3$, $TiO_2$, $HfO_2$, or the like. Alternatively, the dielectric layer 161b may be composed of a single layer or multiple layers as an organic insulator. A thickness of the dielectric layer 161b may be several tens of nanometers to several micrometers.

Furthermore, the substrate 161 according to the present disclosure includes a plurality of cells 161d partitioned by partition walls. The cells 161d may be sequentially arranged along one direction, and made of a polymer material. In addition, the partition wall 161e constituting the cells 161d is configured to be shared with neighboring cells 161d. The partition walls 161e are protruded from the base portion 161a, and the cells 161d may be sequentially arranged along the one direction by the partition walls 161e. More specifically, the cells 161d are sequentially arranged in row and column directions, and may have a matrix structure.

As shown in the drawing, an inside of the cells 161d has a groove for accommodating the semiconductor light emitting device 150, and the groove may be a space defined by the partition walls 161e. The shape of the groove may be the same as or similar to that of the semiconductor light emitting device. For example, when the semiconductor light emitting device is in a rectangular shape, the groove may be a rectangular shape. In addition, although not shown, when the semiconductor light emitting device is circular, the grooves formed in the cells may be formed in a circular shape. Moreover, each of the cells is configured to accommodate a single semiconductor light emitting device. In other words, a single semiconductor light emitting device is accommodated in a single cell.

Meanwhile, the plurality of electrodes 161c include a plurality of electrode lines disposed at the bottom of each of the cells 161d, and the plurality of electrode lines may be configured to extend to neighboring cells.

The plurality of electrodes 161c are disposed below the cells 161d and applied with different polarities to generate an electric field in the cells 161d. In order to form the electric field, the dielectric layer may form the bottom of the cells 161d while the dielectric layer covers the plurality of electrodes 161c. In such a structure, when different polarities are applied to a pair of electrodes 161c from a lower side of each cell 161d, an electric field may be formed, and the semiconductor light emitting device may be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly device may include a magnet 163 for applying a magnetic force to the semiconductor light emitting devices. The magnet 163 is spaced apart from the fluid chamber 162 to apply a magnetic force to the semiconductor light emitting devices 150. The magnet 163 may be disposed to face an opposite side of the assembly surface of the substrate 161, and the location of the magnet is controlled by the position controller 164 connected to the magnet 163.

The semiconductor light emitting device 1050 may have a magnetic body so as to move in the fluid by the magnetic field of the magnet 163.

Referring to FIG. 9, the semiconductor light emitting device of the display device having a magnetic body may include a first conductive electrode 1052 and a second conductive electrode 1056, a first conductive semiconductor layer 1053 disposed with the first conductive electrode 1052, a second conductive semiconductor layer 1055 configured to overlap with the first conductive semiconductor layer 1052, and disposed with the second conductive electrode 1056, and an active layer 1054 disposed between the first and second conductive semiconductor layers 1053, 1055.

Here, the first conductive type and the second conductive type may be composed of p-type and n-type, and vice versa. In addition, as described above, it may be a semiconductor light emitting device without having the active layer.

Meanwhile, in the present disclosure, the first conductive electrode 1052 may be generated after the semiconductor light emitting device is assembled to the wiring board by the self-assembly of the semiconductor light emitting device. In addition, in the present disclosure, the second conductive electrode 1056 may include the magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light emitting device 1050 may include a first layer 1056a and a second layer 1056b. Here, the first layer 1056a may be made to include a magnetic material, and the second layer 1056b may include a metal material other than the magnetic material.

As illustrated, in this example, the first layer 1056a including a magnetic body may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not necessarily limited thereto, and the magnetic body may be disposed on one surface of the first conductive semiconductor layer.

Referring again to FIGS. 6 and 7, more specifically, the self-assembly device may include a magnet handler that can be automatically or manually moved in the x, y, and z axes on the top of the fluid chamber or include a motor capable of rotating the magnet 163. The magnet handler and the motor may constitute the position controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light emitting devices may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembling apparatus described above is configured to use a combination of a magnetic field and an electric field, and using those fields, the semiconductor light emitting devices may be placed at preset positions of the substrate by an electric field in the process of being moved by a location change of the magnet. Hereinafter, an assembly process using the self-assembly device described above will be described in more detail.

First, a plurality of semiconductor light emitting devices 1050 having magnetic bodies are formed through the process described with reference to FIGS. 5A through 5C. In this case, a magnetic body may be deposited on the semiconductor light emitting device in the process of forming the second conductive electrode in FIG. 5C.

Figure 8A:
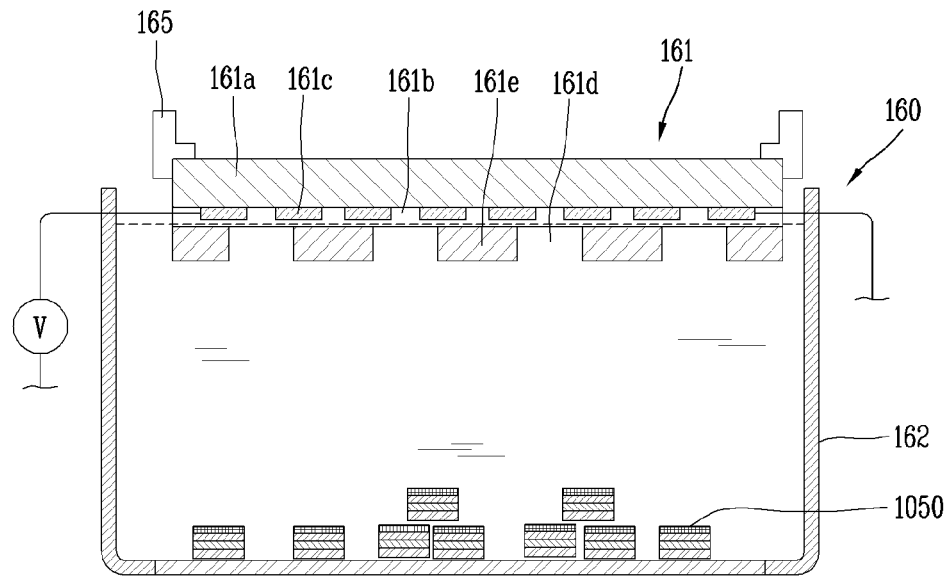
FIGS. 8A to 8E are conceptual views showing a process of self-assembling semiconductor light emitting devices using the self-assembly device in FIG. 6.
Figure 9:
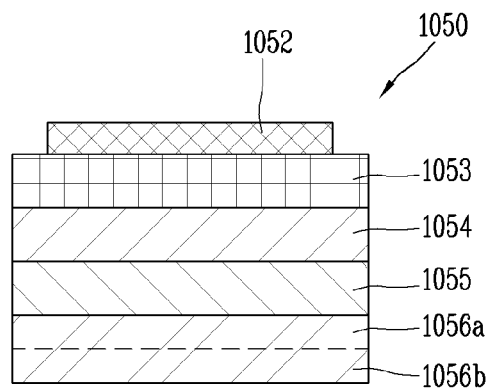
FIG. 9 is a conceptual view for explaining the semiconductor light emitting device in FIGS. 8A to 8E.

Next, the substrate 161 is transferred to the assembly position, and the semiconductor light emitting devices 1050 are placed into the fluid chamber 162 (FIG. 8A).

As described above, the assembly position of the substrate 161 is a position at which the assembly surface on which the semiconductor light emitting devices 1050 of the substrate 161 are assembled is disposed in a downward direction in the fluid chamber 162.

In this case, some of the semiconductor light emitting devices 1050 may sink to the bottom of the fluid chamber 162 and some may float in the fluid. When the light transmitting bottom plate 166 is provided in the fluid chamber 162, some of the semiconductor light emitting devices 1050 may sink to the bottom plate 166.

Figure 8B:
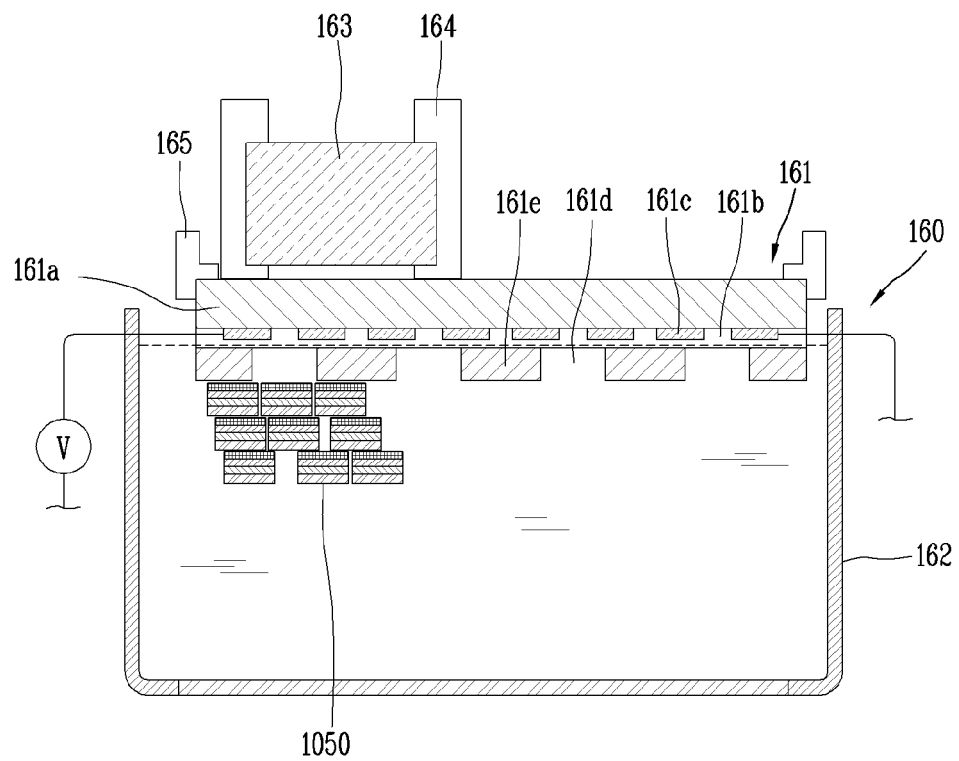

Next, a magnetic force is applied to the semiconductor light emitting devices 1050 so that the semiconductor light emitting devices 1050 float in the fluid chamber 162 in a vertical direction (FIG. 8B).

When the magnet 163 of the self-assembly device moves from its original position to an opposite side of the assembly surface of the substrate 161, the semiconductor light emitting devices 1050 float in the fluid toward the substrate 161. The original position may be a position away from the fluid chamber 162. For another example, the magnet 163 may be composed of an electromagnet. In this case, electricity is supplied to the electromagnet to generate an initial magnetic force.

Meanwhile, in this example, a separation distance between the assembly surface of the substrate 161 and the semiconductor light emitting devices 1050 may be controlled by adjusting the magnitude of the magnetic force. For example, the separation distance is controlled using the weight, buoyancy, and magnetic force of the semiconductor light emitting devices 1050. The separation distance may be several millimeters to tens of micrometers from the outermost edge of the substrate.

Figure 8C:
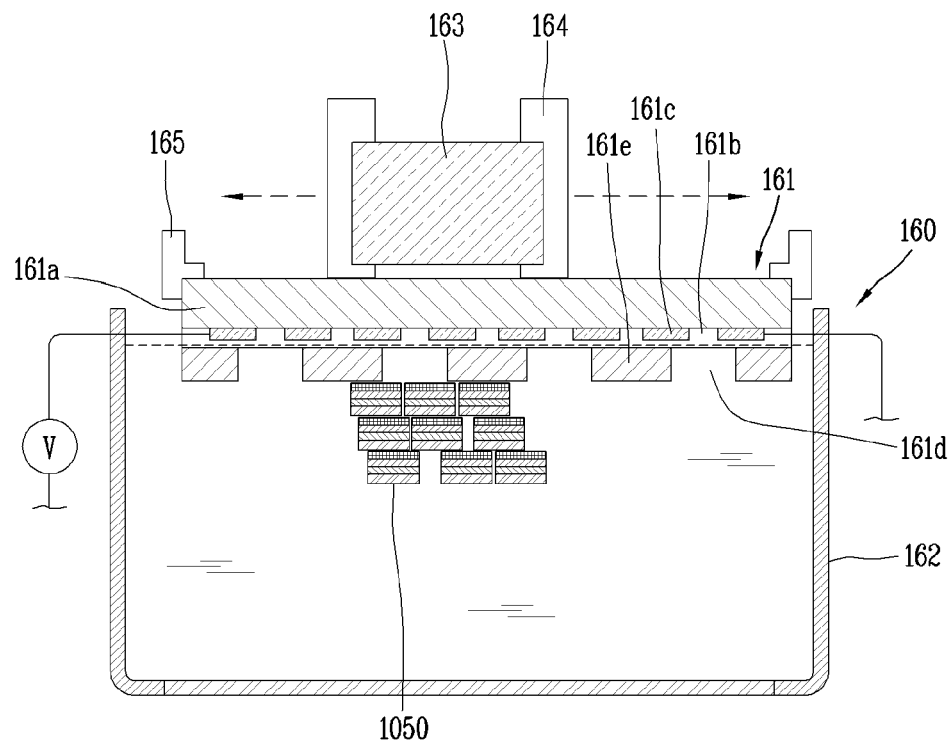
Figure 8D:
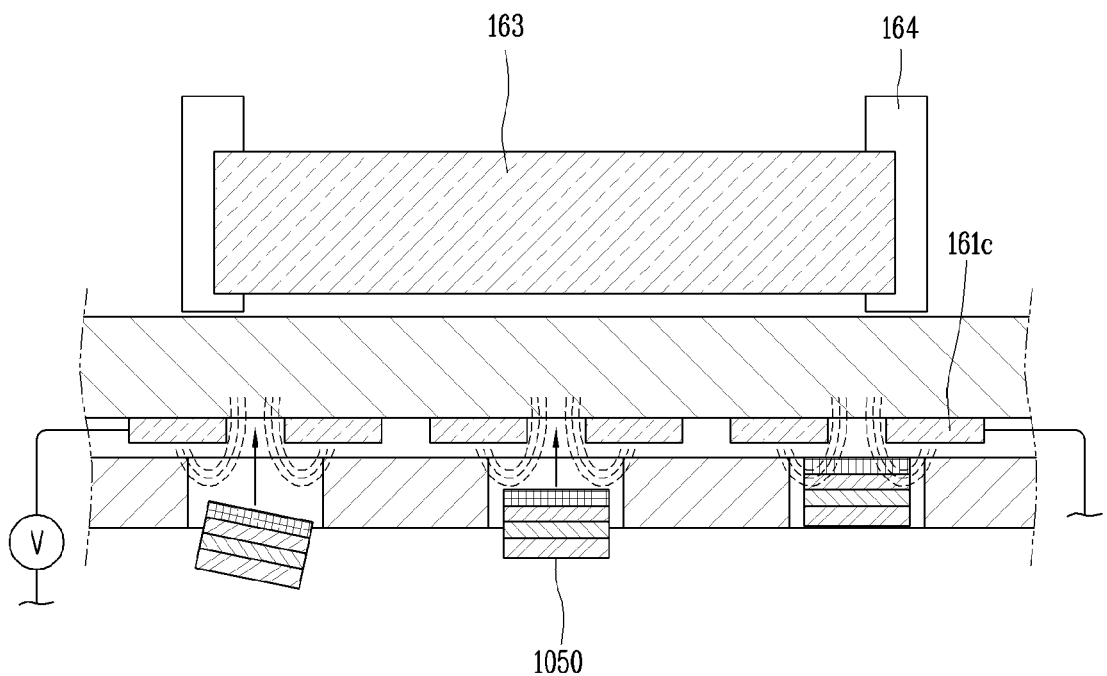

Next, a magnetic force is applied to the semiconductor light emitting devices 1050 so that the semiconductor light emitting devices 1050 move in one direction in the fluid chamber 162. For example, the magnet 163 moves in a horizontal direction, a clockwise direction or a counterclockwise direction with respect to the substrate (FIG. 8C). In this case, the semiconductor light emitting devices 1050 move in a direction parallel to the substrate 161 at a position spaced apart from the substrate 161 by the magnetic force.

Next, the process of applying an electric field to guide the semiconductor light emitting devices 1050 to preset positions of the substrate 161 so as to allow the semiconductor light emitting devices 1050 to be placed at the preset positions during the movement of the semiconductor light emitting devices 1050 is carried out (FIG. 8C). For example, the semiconductor light emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to carry out assembly only at preset positions. In other words, the semiconductor light emitting devices 1050 are assembled to the assembly position of the substrate 161 using a selectively generated electric field. For this purpose, the substrate 161 may include cells in which the semiconductor light emitting devices 1050 are inserted.

Then, the unloading process of the substrate 161 is carried out, and the assembly process is completed. When the substrate 161 is an assembly substrate, a post-process of transferring the aligned semiconductor light emitting devices to a wiring substrate as described above to implement a display device may be carried out.

Figure 8E:
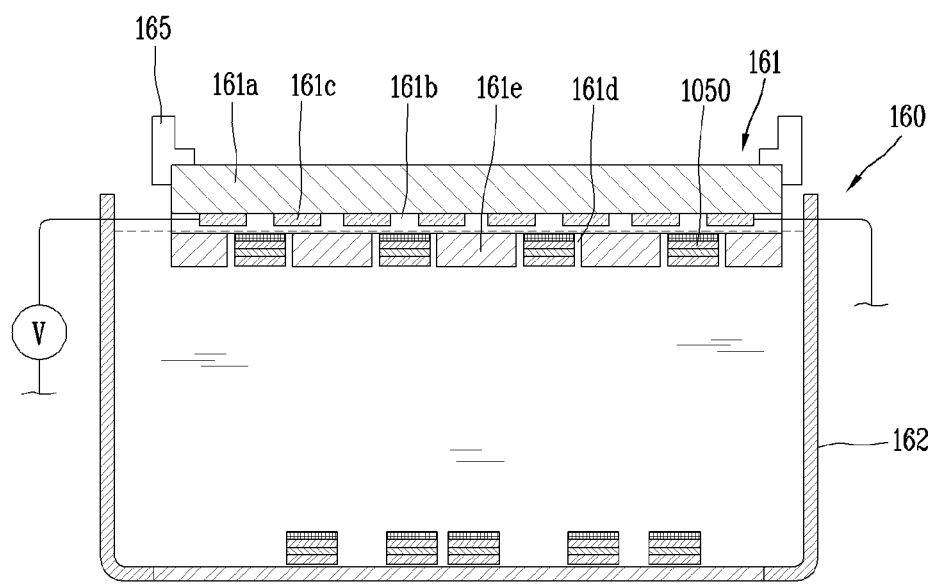

On the other hand, the semiconductor light emitting devices 1050 may be guided to the preset positions, then the magnet 163 may move in a direction away from the substrate 161 such that the semiconductor light emitting devices 1050 remaining in the fluid chambers 162 fall to the bottom of the fluid chambers 162, (FIG. 8E). For another example, if power supply is stopped when the magnet 163 is an electromagnet, then the semiconductor light emitting devices 1050 remaining in the fluid chamber 162 fall to the bottom of the fluid chamber 162.

Then, when the semiconductor light emitting devices 1050 on the bottom of the fluid chamber 162 are collected, the collected semiconductor light emitting devices 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light emitting devices may be assembled at one time in a display device in which individual pixels are formed with semiconductor light emitting devices.

As described above, according to the present disclosure, a large number of semiconductor light emitting devices may be pixelated on a wafer having a small size, and then transferred onto a large-area substrate. Through this, it may be possible to manufacture a large-area display device at a low cost.

Meanwhile, the present disclosure provides an apparatus and method for improving the accuracy of the self-assembly process described in FIGS. 8A to 8E.

Figure 10:
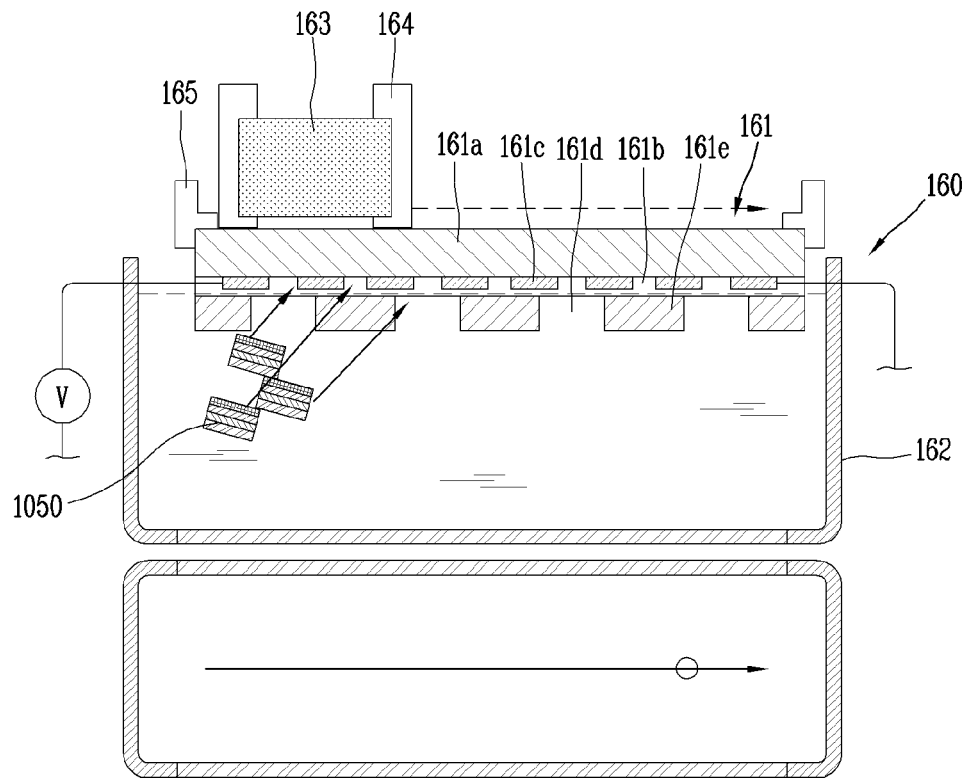
FIG. 10 is a conceptual view showing the movement of semiconductor light emitting devices when a magnet is moved in a straight line.
Figure 11:
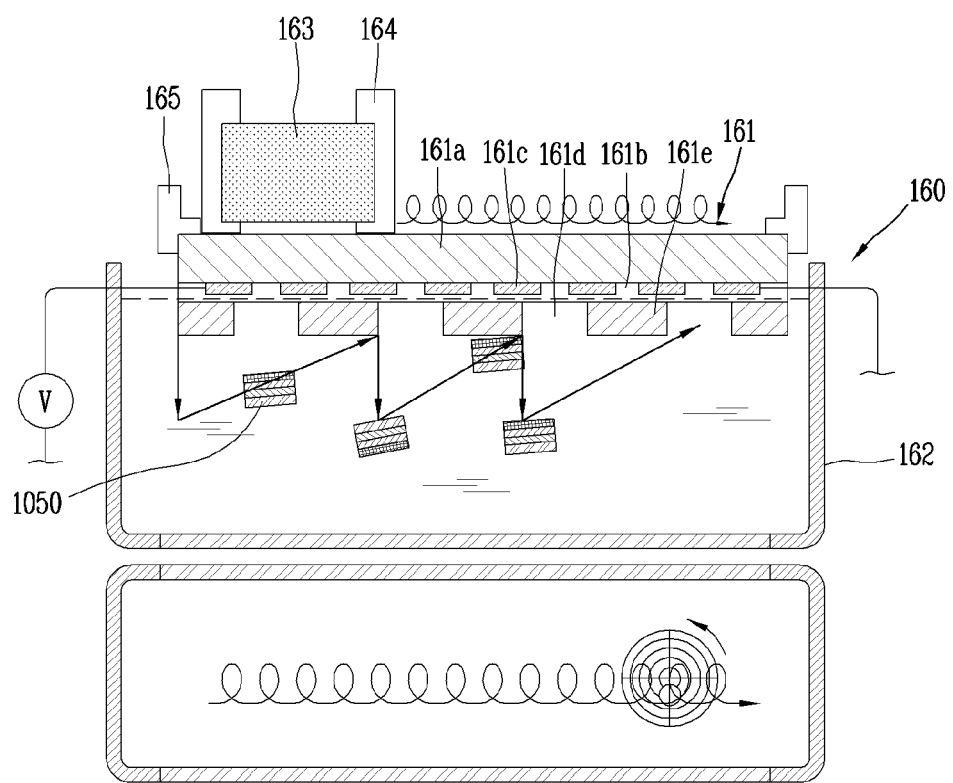
FIG. 11 is a conceptual view showing a self-assembly method according to the present disclosure.

FIG. 10 is a conceptual view showing the movement of semiconductor light emitting devices when a magnet is moved in a straight line, and FIG. 11 is a conceptual view showing a self-assembly method according to the present disclosure.

As described in FIG. 8C, the process of applying a magnetic force to the semiconductor light emitting devices 1050 to move the semiconductor light emitting devices 1050 in one direction in the fluid chamber 162 is carried out.

At this time, as shown in FIG. 10, the semiconductor light emitting devices may move in a straight line along a magnet by transferring the magnet in a straight line in one direction. In this case, a magnetic force acting on the semiconductor light emitting device is formed in a direction obliquely facing the substrate.

Various structures such as partition walls for mounting the semiconductor light emitting devices may be disposed on a surface of the substrate, and when a magnetic force acting on the semiconductor light emitting devices is formed in a direction obliquely facing the substrate, a frictional force between the substrate and the semiconductor light emitting device increases excessively.

Due to the frictional force, the movement of the semiconductor light emitting devices in a fluid is restricted, and furthermore, a semiconductor light emitting device and a surface of the substrate may be damaged. In addition, due to the frictional force, semiconductor light emitting devices may be unable to easily follow the magnet, thereby increasing transfer time.

Referring to FIG. 11, in order to solve the above-described problem, the present disclosure rotates the magnet with respect to a rotation axis, and transfers the rotation axis along one direction in the step of applying a magnetic force to the semiconductor light emitting devices.

Here, the rotation axis may be a virtual axis, and in the case of a virtual axis with the rotation axis, transferring the rotation axis denotes changing the position of the virtual rotation axis.

When the magnet 163 is rotated, a distance between the semiconductor light emitting device and the magnet in the fluid chamber periodically changes. Specifically, when the magnet 163 is rotated, a time when the distance between the magnet 163 and the semiconductor light emitting device 1050 becomes far occurs, and a time when the distance between the magnet 163 and the semiconductor light emitting device 1050 becomes close occurs. For this reason, a constant magnetic force is not applied to the semiconductor light emitting device 1050.

During the time when the distance between the magnet 163 and the semiconductor light emitting device 1050 becomes far, the effect of gravity becomes greater than that of the magnetic force on the semiconductor light emitting device 1050. Accordingly, the semiconductor light emitting device 1050 falls to the bottom of the fluid for a predetermined period of time.

Meanwhile, during the time when the distance between the magnet 163 and the semiconductor light emitting device 1050 becomes close, the effect of magnetic force on the semiconductor light emitting device 1050 becomes greater than that of gravity. Accordingly, the semiconductor light emitting device 1050 moves toward the substrate 161a for a predetermined period of time.

As described above, when the rotation axis is transferred in one direction while rotating the magnet 163, the semiconductor light emitting device 1050 moves vertically and horizontally with respect to the substrate 161a. Accordingly, the semiconductor light emitting device 1050 moves horizontally with respect to the substrate 161a without being in contact with the substrate 161a for a predetermined period of time. When the semiconductor light emitting device 1050 moves horizontally with respect to the substrate 161a without being in contact with the substrate 161a, a frictional force does not act between the semiconductor light emitting device 1050 and the substrate 161a. Through this, the present disclosure prevents the phenomenon that the movement of the semiconductor light emitting device 1050 is restricted or the substrate 161a and the semiconductor light emitting device 1050 are damaged due to a frictional force between the semiconductor light emitting device 1050 and the substrate 161a.

Here, according to the present disclosure, the effects of magnetic force and gravity on the semiconductor light emitting device 1050 are alternately increased by changing the horizontal distance between the magnet 163 and the semiconductor light emitting device 1050. To this end, the rotation axis must be formed perpendicular to the substrate 161a.

On the other hand, when the rotation axis is formed at the center of the magnet or inside the magnet, there is little change in a horizontal distance between the magnet 163 and the semiconductor light emitting device 1050 due to rotation. Therefore, the rotation axis is preferably formed outside the magnet 163.

On the other hand, the present disclosure utilizes a plurality of magnets to reduce the process time.

Figure 12:
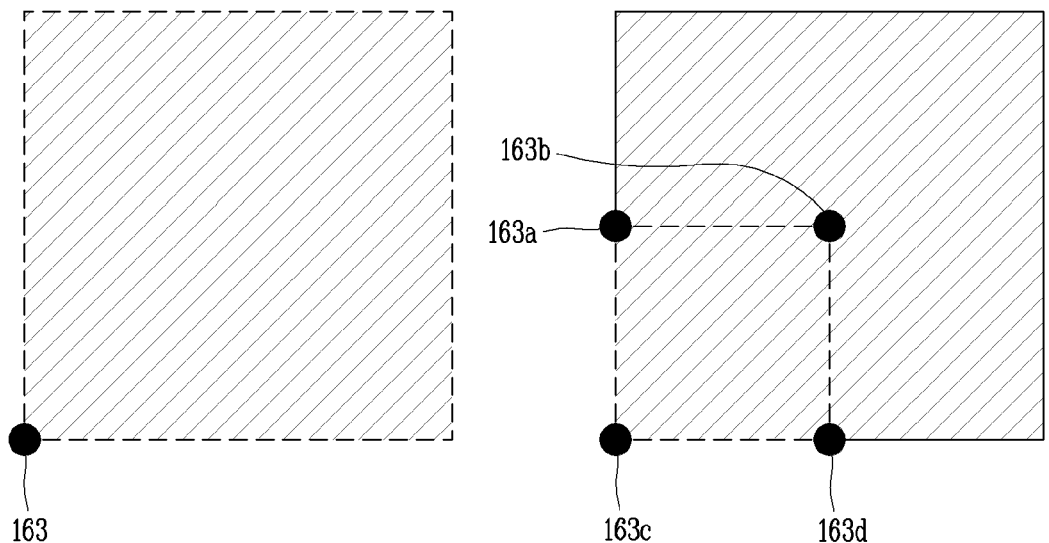
FIGS. 12 and 13 are conceptual views showing an embodiment of the present disclosure that uses a plurality of magnets.
Figure 13:
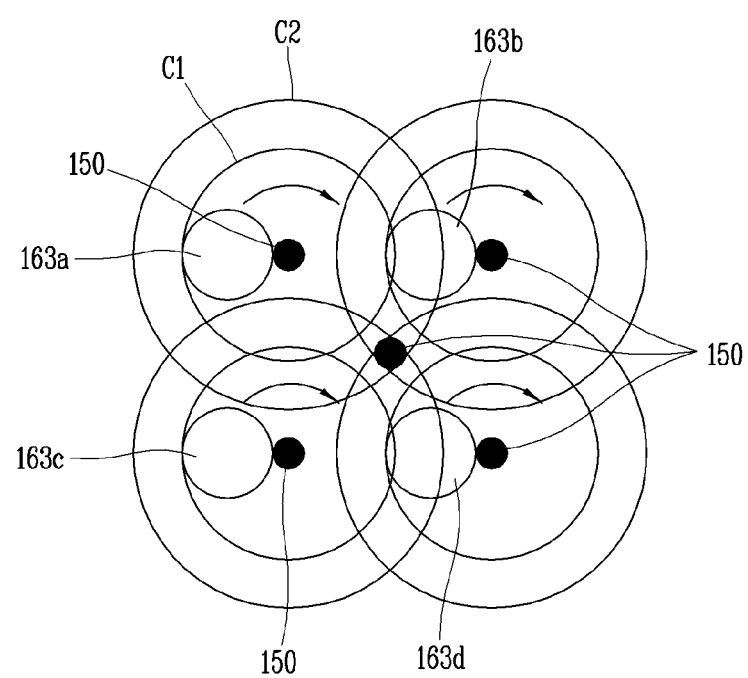

FIGS. 12 and 13 are conceptual views showing an embodiment of the present disclosure that uses a plurality of magnets.

During self-assembly, a magnetic force above a predetermined intensity must be formed in the entire region of the substrate. The magnetic force does not need to be formed on the entire substrate at the same time, and may be formed sequentially from one region of the substrate.

In order to sequentially form a magnetic force from one region of the substrate 161a, the magnet 163 must pass through the entire region of the substrate 161a. While the magnet 163 passes through the substrate 161a, the magnet 163 must be within a predetermined distance in any region of the substrate 161a for a predetermined period of time. When manufacturing a single large-area display device, the area of the substrate 161a becomes very large. When a single magnet passes over the entire region of a large-area substrate, the process time may be increased. The present disclosure utilizes a plurality of magnets in order to reduce the self-assembly process time.

For example, referring to FIG. 12, the time for passing the entire region of the substrate with the four magnets 163a to 163d is shorter than the time for passing the entire region of the substrate with the single magnet 163. The present disclosure utilizes this point to transfer a plurality of magnets along one direction while rotating the plurality of magnets together. Through this, the present disclosure may reduce the self-assembly process time.

Meanwhile, when a plurality of magnets are rotated together, a rotation axis for each of the plurality of magnets may be formed. At this time, a distance between the center of each of the plurality of magnets and the rotation axis, and a distance between the plurality of magnets are important.

For example, as shown in FIG. 13, when rotating four cylindrical magnets 163a to 163d together, a region (c1) in which each magnet passes and a region (c2) in which a magnetic force above a predetermined intensity is formed by each magnet are formed. The regions (c2) for each magnet may overlap each other, and thus, the semiconductor light emitting devices may be concentrated in an undesired region.

In order to prevent this, a radius of rotation of the magnet must be at least 20% of a diameter of the magnet and less than a distance between the magnets. Preferably, the radius of rotation must be equal to the radius of the magnet.

Meanwhile, the present disclosure is provided with a device for rotating a plurality of magnets together.

Figure 14:
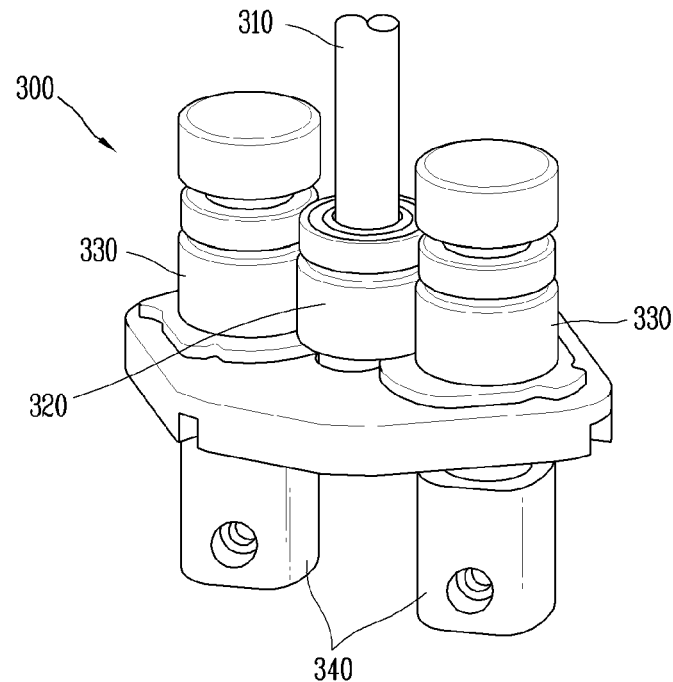
FIGS. 14 to 16 are conceptual views showing the structure of a magnet position controller.
Figure 15:
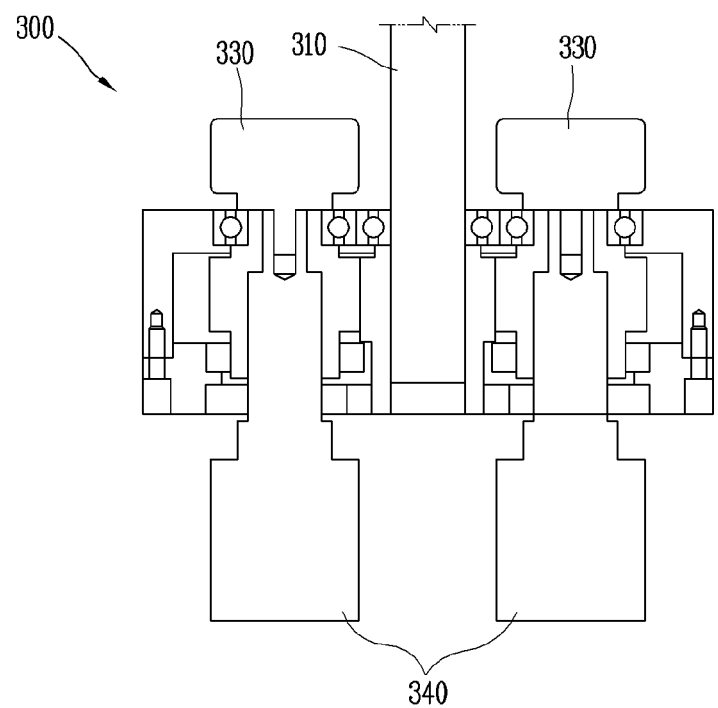
Figure 16:
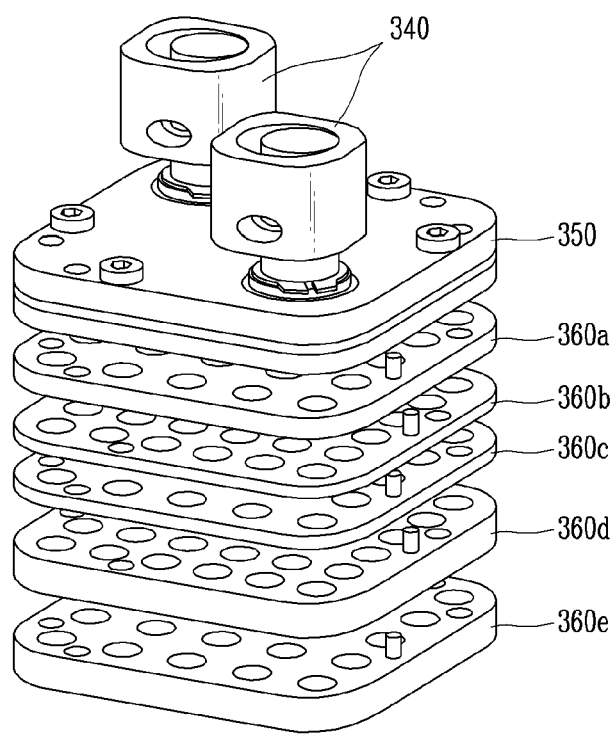

FIGS. 14 to 16 are conceptual views showing the structure of a magnet position controller. Referring to the drawings, a position controller 300 for rotating a plurality of magnets together may include a rotating rod 310, an intermediate gear 320, a rotating gear 330, and a magnet array 360a to 360e.

The intermediate gear 320 is fixed to the rotating rod 310 to rotate as the rotating rod 310 rotates. The intermediate gear 320 and the rotating gear 330 are engaged with each other, and the rotating gear 330 also rotates as the intermediate gear 320 rotates.

A separate connection member 340 may be fixed to the rotating gear 330, the connection member 340 may be connected to a fixing plate 350, and the fixing plate 350 may be coupled to a magnet array 360a to 360e to which a plurality of magnets are fixed. The magnet array 360a to 360e may be defined in various shapes depending on a shape of the magnet and a distance between the magnets. The present disclosure makes it possible to easily change a magnet arrangement by replacing the magnet array 360a to 360e.

Meanwhile, the fixing plate 350 may be made of a paramagnetic material such as an iron plate, allowing the magnet to be fixed to the fixing plate 350 only by a magnetic force.

In summary, as the rotating rod 310 rotates, the intermediate gear 320 rotates. The rotating gear 330 engages with the intermediate gear 320 to rotate together, thereby causing plate-like rotation of the magnet array 360a to 360e. In embodiments, rotating rod 310 can be aligned with the rotation axis, and the magnet can rotate by orbiting about the rotation axis.

Here, at least one of the intermediate gear 320 and the rotating gear 330 may be provided with an auxiliary shaft for adjusting a radius of rotation.

The foregoing position controller is only an embodiment of the present disclosure, and does not limit the structure of the position controller. The position controller need not necessarily be defined in the structure described in FIGS. 14 to 16.

On the other hand, the present disclosure provides a structure and method for solving a problem that occurs when the substrate is bent during the process of FIGS. 8A to 8E.

Specifically, as the size of a display device to be manufactured increases, an area of the substrate increases. When a large-area substrate is disposed at an assembly position, a phenomenon in which a middle portion of the substrate is sagged down may occur due to a load of the substrate.

When a magnetic force is applied to the semiconductor light emitting device through a magnet array while the substrate is bent, a distance between the substrate and the magnet varies for each region of the substrate. Specifically, referring to four magnets on the right side of FIG. 17, when the substrate is bent, distances between the substrate and a magnet disposed at an edge of the substrate and a magnet disposed at a central portion of the substrate, respectively, among the magnets disposed in the magnet array, are different from each other.

Accordingly, a non-uniform magnetic force is applied to the semiconductor light emitting devices placed into the fluid chamber. This becomes a factor that lowers the assembly yield of the semiconductor light emitting devices.

In order to solve this, the present disclosure allows the magnet to come into close contact with the substrate in the process of applying a magnetic force to the semiconductor light emitting devices. Specifically, the present disclosure allows the magnet to move up and down with respect to the substrate while being transferred along with rotation.

Figure 17:
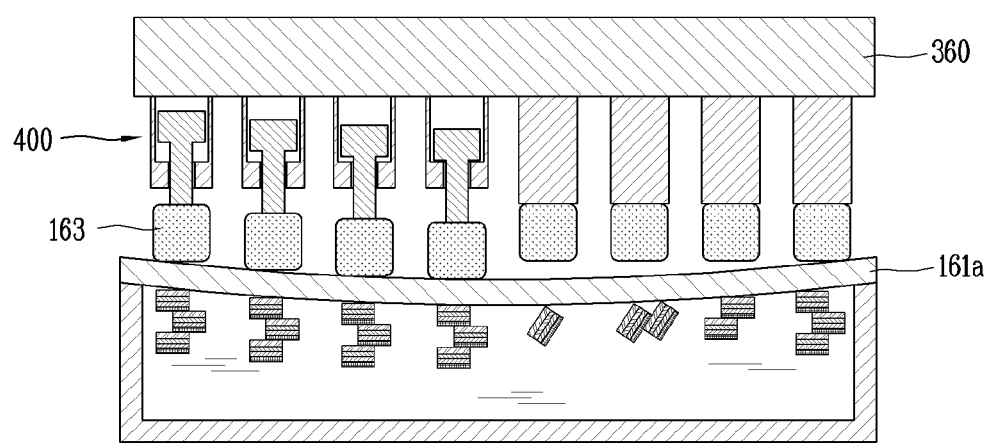
FIG. 17 is a conceptual view showing a change in distance between a magnet and a substrate in a state that the substrate is bent.

Referring to the left four magnets 163 of FIG. 17, for a magnet array 360, the magnet 163 moves downward to be brought into close contact with the substrate 161a in a region where the substrate is bent downward. On the contrary, in a region where the substrate is not bent, the magnet moves upward to be brought into close contact with the substrate while at the same time preventing an excessive frictional force from being formed between the substrate and the magnet.

To this end, the present disclosure may further include a magnet connecting portion for guiding the vertical movement of the magnet with respect to the substrate.

Figure 18:
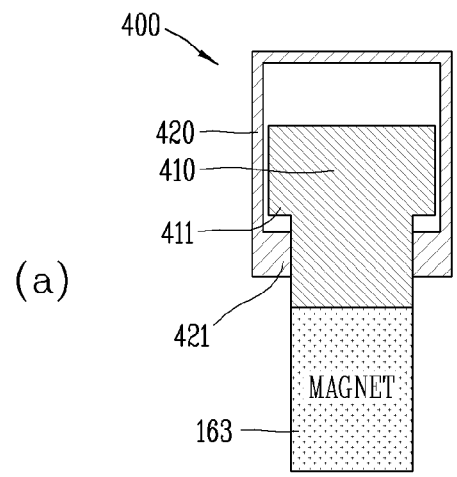
FIGS. 18 to 20 are cross-sectional views of a magnet connecting portion.
Figure 18:
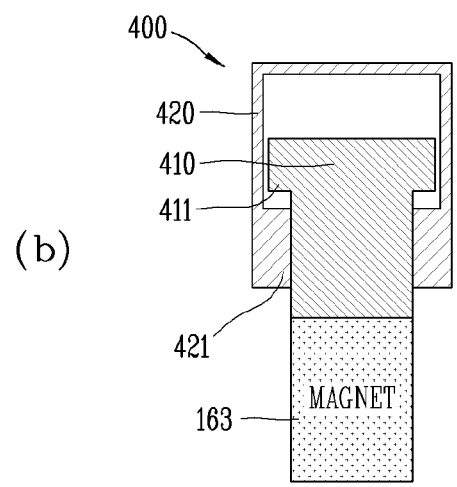
Figure 18:
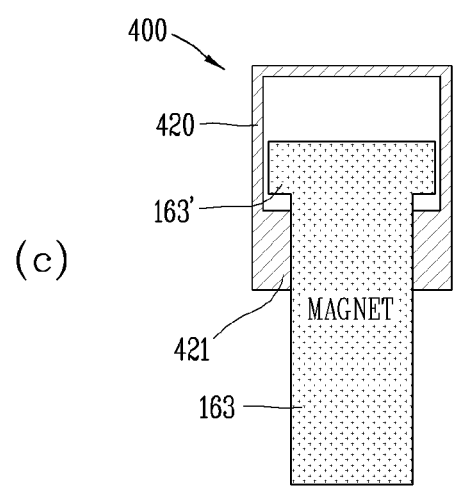
Figure 19:
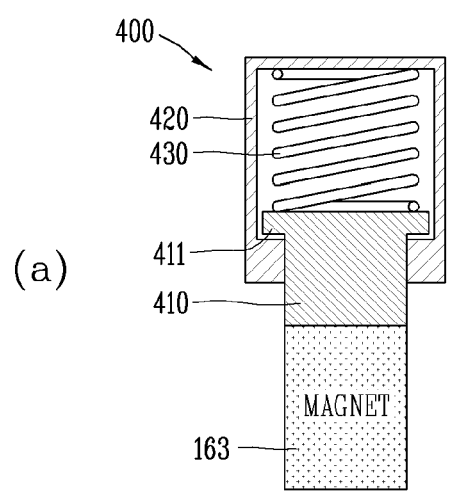
Figure 19:
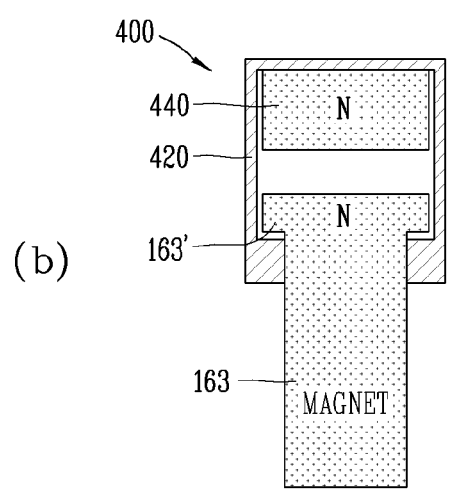
Figure 20:
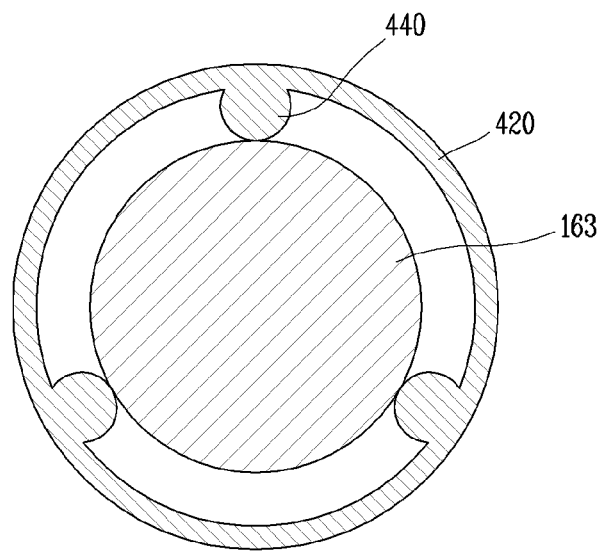

FIGS. 18 to 20 are cross-sectional views of a magnet connecting portion.

Referring to FIG. 18, a magnet connecting portion 400 may include a moving member 410 that fixes the magnet and a guide 420 that guides the vertical movement of the moving member 410. A recess portion into which the moving member 410 can be inserted may be defined in the guide 420. A sidewall of the guide 420 guides the moving member 410 to allow only vertical movement.

On the other hand, protruding portions 411 and 421 may be disposed at the moving member 410 and the guide 420, respectively, to prevent the moving member 410 from being completely separated from the guide 420. When the moving member 410 reaches a lower side of the guide 420, the protruding portion 411 disposed at the moving member 410 is engaged with the protruding portion 421 disposed at the guide 420.

As shown in (a) of FIG. 18, the magnet 163 is fixed to a lower side of the moving member 410. The moving member 410 may be made of a paramagnetic material such that the magnet is fixed to the moving member 410 only by magnetic force, but the present disclosure is not limited thereto.

On the other hand, as shown in (a) and (b) of FIG. 18, according to the present invention, the protruding portions 411 and 421 disposed at the moving member 410 and the guide 420, respectively, may have various thicknesses. A vertical distance through which the moving member 410 is able to move may vary according to the thicknesses of the protruding portions 411 and 421.

On the other hand, the magnet connecting portion 400 may not include the foregoing moving member. Specifically, as shown in (c) of FIG. 18, a magnet 163 may be inserted into a recess portion disposed at the guide 420. Here, protruding portions 163' and 421 may be disposed at the magnet 163 and the guide 420, respectively, to prevent the magnet 163 from being completely separated from the guide 420. When the magnet 163 reaches a lower side surface of the guide 420, the protruding portion 163' disposed at the magnet 163 is engaged with the protruding portion 421 disposed at the guide 420.

According to the structure described in FIG. 18, when a magnet is transferred onto a substrate including a curved surface on at least part thereof, the magnet is brought into close contact with an upper surface of the substrate through vertical movement. In this case, a force applied to the substrate may be a sum of the weights of the fixing member and the magnet or equal to the weight of the magnet.

On the other hand, the structure described in FIG. 18 is a structure in which the magnet is brought into close contact with the substrate by gravity. On the contrary, the present disclosure provides a structure in which the magnet is brought into close contact with the substrate with a stronger force.

Referring to FIG. 19, the magnetic connecting portion may include at least one of an elastic member that applies an elastic force to the magnet and a magnetic member that applies a magnetic force to the magnet. As shown in (a) of FIG. 19, an elastic member 430 may be disposed in the recess portion of the guide 420. The elastic member 430 pushes the moving member 410 out of the recess portion. An elastic force formed by the elastic member 430 allows the magnet 163 to be strongly brought into close contact with the substrate.

In another embodiment, as shown in (b) of FIG. 19, a magnetic member 440 may be disposed at the recess portion of the guide 420. The magnetic member 440 pushes the moving member 410 out of the recess portion. A magnetic force formed by the magnetic member 440 allows the magnet 163 to be strongly brought into close contact with the substrate. At this time, the magnetic member and the magnet must be arranged such that the same poles face each other.

On the other hand, referring to FIG. 20, a protruding portion 440 may be disposed on an inner surface of the guide 420. The protruding portion 440 prevents the magnet 163 from moving in a direction other than a direction perpendicular to the substrate. Through this, the present disclosure facilitates the vertical movement of the magnet 163, and prevents the magnet from being biased during the rotation and movement of the magnet.

The foregoing magnet connecting portion 400 may be fixed to the magnet array described in FIG. 16, or the magnet connecting portion 400 itself may be integrally formed with the magnet array.

As described above, the magnet connecting portion according to the present disclosure allows the magnet to be brought into close contact with an upper side of the substrate during self-assembly, thereby allowing a distance between the substrate and the magnet to be constant even when the substrate is bent. Through this, the present disclosure allows a uniform magnetic force to be applied to an entire substrate even when an area of the substrate is large. Accordingly, self-assembly yield may be improved.

Meanwhile, according to the present disclosure, when a magnetic force is applied to the semiconductor light emitting device, an assembly surface of the semiconductor light emitting device may maintain a state of facing the substrate.

Specifically, the semiconductor light emitting device may have an assembly surface to be coupled to the substrate, and an upper surface and a side surface facing the assembly surface. When an assembly surface of the semiconductor light emitting device is brought into contact with a designated position of the substrate, a width direction of the semiconductor light emitting device is in a state of being horizontal to the substrate. When the width direction of the semiconductor light emitting device is perpendicular to the substrate, that is, when the semiconductor light emitting device is placed perpendicular to the substrate, it becomes difficult for the semiconductor light emitting device to be accurately coupled to the designated position of the substrate.

The present disclosure allows a width direction of the semiconductor light emitting device to be maintained horizontal with the substrate while a magnetic force is applied to the semiconductor light emitting device.

Figure 21:
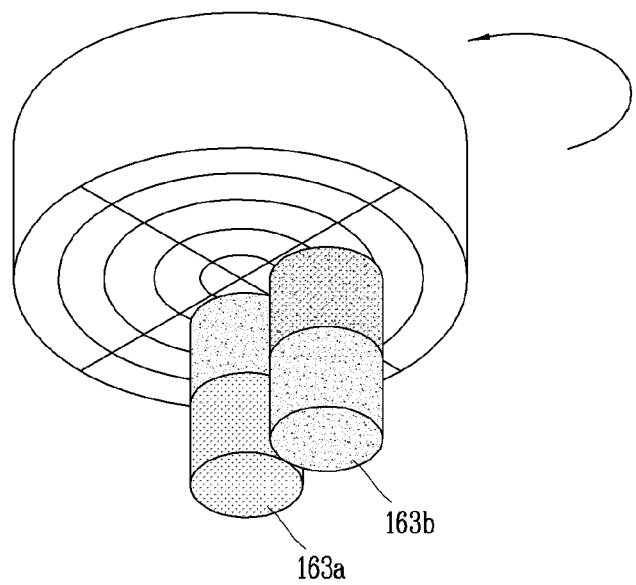
FIGS. 21 and 22 are conceptual views showing an embodiment in which a direction of magnetic force is adjusted when semiconductor light emitting devices are self-assembled.
Figure 22:
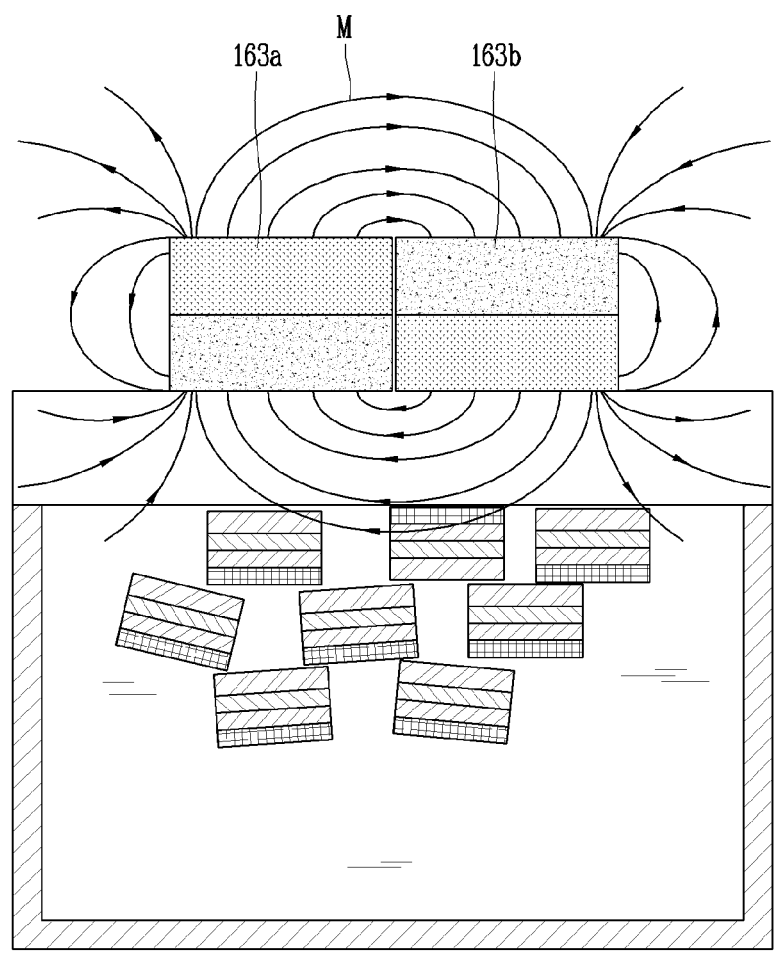

FIGS. 21 and 22 are conceptual views showing an embodiment in which a direction of magnetic force is adjusted when semiconductor light emitting devices are self-assembled.

The N-pole and S-pole of the magnet may be disposed in a direction horizontal to the substrate such that the magnetic force applied to the semiconductor light emitting devices is in a direction horizontal to the substrate. In the case of arranging the magnet in this way, the direction of the magnetic force on a surface of the substrate becomes a direction horizontal to the substrate. Accordingly, the assembly surfaces of the semiconductor light emitting devices aggregated around the substrate are disposed to face the substrate.

Meanwhile, the present disclosure utilizes a plurality of magnets in order to increase the intensity of magnetic force acting on the semiconductor light emitting device.

In one embodiment, referring to FIG. 21, a magnet according to the present disclosure includes a first magnet 163$a$ such that either one of N and S poles thereof is disposed to face the substrate, and a second magnet 163$b$ disposed at a position adjacent to the first magnet 163$a$ such that the other one of the N and S poles thereof is disposed to face the substrate.

As shown in FIG. 21, when a plurality of magnets are disposed adjacent to each other, magnetic force lines as shown in FIG. 22 are formed around the substrate. Accordingly, a magnetic force is formed in a direction horizontal to the substrate at a position adjacent to the substrate surface. Through this, the present disclosure prevents the semiconductor light emitting device from being vertically disposed on the substrate by a magnetic force applied to the semiconductor light emitting device, and guides an assembly surface of the semiconductor light emitting device to be accurately coupled to the substrate.

According to the present disclosure, it may be possible to minimize a frictional force that may be generated between the substrate and the semiconductor light emitting device during transfer to the substrate. Through this, the present disclosure may prevent the semiconductor light emitting device from being damaged during assembly or being excessively aggregated at one location, and moreover, may improve transfer accuracy.

Furthermore, according to the present disclosure, when a magnetic force is applied to the semiconductor light emitting device, the semiconductor light emitting device is disposed horizontally on the substrate. Through this, the present disclosure may allow the semiconductor light emitting devices to be accurately seated at designated positions on the substrate.

Moreover, according to the present disclosure, even when the substrate having a large area is bent during transfer, a distance between the semiconductor light emitting device and magnets may be kept constant, and accordingly, a magnetic force applied to the semiconductor light emitting device may become uniform. Through this, the present disclosure may improve transfer accuracy.

What is claimed is:

1. A self-assembly apparatus of a semiconductor light emitting device, the self-assembly apparatus comprising:
   a fluid chamber configured to accommodate a plurality of semiconductor light emitting devices, each semiconductor light emitting device having a magnetic body;
   a magnet disposed to be spaced apart from the fluid chamber and configured to apply a magnetic force to the plurality of semiconductor light emitting devices;
   a position controller connected to the magnet, and configured to control a position of the magnet; and
   a power supply configured to induce formation of an electric field on a substrate placed at an assembly position, so that the plurality of semiconductor light emitting devices are seated at preset positions on the substrate while being moved due to a positional change of the magnet,
   wherein the position controller transfers the magnet in one direction while rotating the magnet about a rotation axis for the magnet, and
   wherein the rotation axis is perpendicular to the substrate, and disposed outside the magnet.

2. The self-assembly apparatus of claim 1, wherein the magnet is provided in plural, and
   wherein the position controller transfers the plurality of magnets in the one direction while rotating the plurality of magnets together about a rotation axis for the plurality of magnets.

3. The self-assembly apparatus of claim 1, wherein the position controller is provided with a magnetic array to which a plurality of magnets are fixed, the plurality of magnets including the magnet, and
   wherein the position controller transfers the magnetic array while rotating the magnetic array.

4. The self-assembly apparatus of claim 1, wherein N and S poles of the magnet are disposed in a direction horizontal to the substrate so that a magnetic force applied to the plurality of semiconductor light emitting devices is formed in a direction horizontal to the substrate.

5. The self-assembly apparatus of claim 4, wherein the magnet comprises:
   a first magnet in which either one of the N and S poles thereof is disposed to face the substrate; and
   a second magnet disposed at a position adjacent to the first magnet so that the other one of the N and S poles thereof is disposed to face the substrate.

6. The self-assembly apparatus of claim 1, further comprising:
   a magnet connecting portion that connects the magnet and the position controller to guide a vertical movement of the magnet with respect to the substrate.

7. The self-assembly apparatus of claim 6, wherein at least a part of the substrate includes a curved surface at the assembly position, and
   wherein the magnet connecting portion guides the vertical movement of the magnet so that the magnet is brought into close contact with the substrate while the magnet is transferred along the one direction with rotation.

8. The self-assembly apparatus of claim 6, wherein the magnet connecting portion comprises at least one of an elastic member that applies an elastic force to the magnet and a magnetic member that applies a magnetic force to the magnet.

9. The self-assembly apparatus of claim 1, wherein the position controller includes a rotating rod that is aligned with the rotation axis, and the magnet rotates by orbiting about the rotation axis.

10. A method of self-aligning a plurality of semiconductor light emitting devices, the method comprising:
    transferring a substrate to an assembly position of a self-assembly apparatus for the plurality of semiconductor light emitting devices, and placing the plurality of semiconductor light emitting devices into a fluid chamber of the self-assembly apparatus;
    applying a magnetic force to the plurality of semiconductor light emitting devices using a magnet to move the plurality of semiconductor light emitting devices along one direction in the fluid chamber; and
    applying an electric field to guide the plurality of semiconductor light emitting devices to preset positions on the substrate so that the plurality of semiconductor light emitting devices are seated at the preset positions during the movement of the plurality of semiconductor light emitting devices,
    wherein the applying of the magnetic force to the plurality of semiconductor light emitting devices transfers the magnet along the one direction while rotating the magnet about a rotation axis for the magnet, and
    wherein the rotation axis is perpendicular to the substrate, and disposed outside the magnet.

11. The method of claim 10, wherein the magnet is provided in plural, and
    wherein the plurality of magnets are transferred along the one direction while rotating together about a rotation axis for the plurality of magnets.

12. The method of claim 10, wherein N and S poles of the magnet are disposed in a direction horizontal to the substrate so that the magnetic force applied to the plurality of semiconductor light emitting devices is formed in a direction horizontal to the substrate.

13. The method of claim 12, wherein the magnet comprises:
    a first magnet in which either one of the N and S poles thereof is disposed to face the substrate; and
    a second magnet disposed at a position adjacent to the first magnet so that the other one of the N and S poles thereof is disposed to face the substrate.

14. The method of claim 10, wherein the applying of the magnetic force to the plurality of semiconductor light emitting devices comprises:
    moving the magnet up and down with respect to the substrate so that the magnet is brought into close contact with the substrate.

15. The method of claim 10, wherein the transfer of the magnet along the one direction while rotating the magnet about the rotation axis for the magnet repeatedly cause the plurality of semiconductor light emitting devices to attach to and/or detach from the substrate with the rotation of the magnet.

16. A self-assembly apparatus of a semiconductor light emitting device, the self-assembly apparatus comprising:

a fluid chamber configured to accommodate a plurality of semiconductor light emitting devices, each semiconductor light emitting device having a magnetic body;

a magnet disposed to be spaced apart from the fluid chamber and configured to apply a magnetic force to the plurality of semiconductor light emitting devices;

a position controller connected to the magnet, and configured to control a position of the magnet;

a power supply configured to induce formation of an electric field on a substrate placed at an assembly position, so that the plurality of semiconductor light emitting devices are seated at preset positions on the substrate while being moved due to a positional change of the magnet; and a transfer unit configured to transfer the substrate to the assembly position, wherein the position controller transfers the magnet in one direction while rotating the magnet about a rotation axis for the magnet, wherein the rotation axis is perpendicular to the substrate, and disposed outside the magnet.

17. A self-assembly apparatus of a semiconductor light emitting device, the self-assembly apparatus comprising:

a fluid chamber configured to accommodate a plurality of semiconductor light emitting devices immersed in a fluid;

a magnet configured to apply a magnetic force to the plurality of semiconductor light emitting devices to draw the plurality of semiconductor light emitting devices towards the magnet;

a position controller configured to control a position of the magnet; and a transfer unit configured to transfer a substrate to an assembly position, wherein the position controller transfers the magnet in one direction while rotating the magnet about a rotation axis for the magnet, and wherein the rotation axis is perpendicular to the substrate, and disposed outside the magnet.

18. The self-assembly apparatus of claim 17, wherein rotating the magnet changes the magnetic force applied to the plurality of semiconductor light emitting devices based on a distance change between the magnet and the plurality of semiconductor light emitting devices.

* * * * *